United States Patent
Sakamoto

(10) Patent No.: US 6,885,082 B2
(45) Date of Patent: Apr. 26, 2005

(54) SEMICONDUCTOR DEVICE WITH BUILT IN ZENER DIODE AND RESISTOR

(75) Inventor: Kazuhisa Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/318,160

(22) Filed: Dec. 13, 2002

(65) Prior Publication Data

US 2003/0116783 A1 Jun. 26, 2003

(30) Foreign Application Priority Data

Dec. 13, 2001 (JP) .................................. 2001-379721

(51) Int. Cl.[7] ..................... H01L 27/082; H01L 27/102; H01L 29/70; H01L 31/11
(52) U.S. Cl. ....................................... 257/577; 257/603
(58) Field of Search .................................. 257/577, 603

(56) References Cited

U.S. PATENT DOCUMENTS 4,293,868 A * 10/1981 Iizuka et al. .............. 257/577
4,672,403 A * 6/1987 Jennings .................... 257/606
2002/0024114 A1 * 2/2002 Sakamoto .................. 257/565

FOREIGN PATENT DOCUMENTS

JP 58-066356 A * 4/1983 .................. 257/119

* cited by examiner

Primary Examiner—Howard Weiss
(74) Attorney, Agent, or Firm—Morgan Lewis & Bockius LLP

(57) ABSTRACT

The present invention provides a semiconductor device having a bipolar transistor constructed so as to allow the adjustment of the base input signal voltage that switches on a transistor in which a diffusion region of a different conductivity type from that of the base region is formed at the contact of the base electrode, and to allow the base current to be controlled when a digital transistor is produced. A base electrode connection region 24 of an n+-type is provided to a p-type base region 12, and a zener voltage control diffusion region 25 of a p+-type is provided around the periphery of the base electrode connection region 24 so as to form a pn junction and undergo zener breakdown at the desired voltage. A resistor 26 composed of polysilicon is connected to the base electrode connection region 24 via a metal electrode 16a. As a result, this semiconductor device has a bipolar transistor in which a zener diode ZD and the resistor 26 are serially built into the base.

2 Claims, 8 Drawing Sheets

SEMICONDUCTOR DEVICE WITH BUILT IN ZENER DIODE AND RESISTOR

BACKGROUND OF THE INVENTION

1. Field of the Invention

The present invention relates to a semiconductor device that operates a voltage driven digital transistor, the kind that operates when a certain voltage or higher is applied to the base of a bipolar transistor, and more particularly relates to a semiconductor device that operates a digital transistor constructed such that a zener diode is built into a base, the operating voltage can be adjusted to the desired level, and the transistor will not break down even when a large current is applied.

2. Description of the Related Art

FIG. 6 illustrates the fundamental structure of a bipolar transistor used in the past. A p-type base region 12 is formed at the top part of an n-type semiconductor layer 11, and an n-type emitter region 13 is formed inside this p-type base region 12. A base electrode 16 is joined to the base region 12 via a contact region 14 of a p$^+$-type, and an emitter electrode 17 is joined to the emitter region 13. A collector electrode 18 is provided on the back of a lower n$^+$-type semiconductor substrate 11a of the n-type semiconductor layer 11. The numeral 19 indicates an insulating film.

When a bipolar transistor structured such as this is used to produce a voltage driven transistor such as a digital transistor, as shown in FIG. 7, for example, the circuit is configured so that the transistor Q is switched on and a collector current $I_C$ flows corresponding to a base current $I_B$ when a power supply voltage $V_{CC}$ is applied between the collector and emitter through a resistor $R_1$ and a specific voltage is applied to the base of a bipolar transistor Q through split resistors $R_2$ and $R_3$, but the transistor Q is not switched on when the specified voltage applied to the base is not attained.

As mentioned above, a digital transistor is an element in which a circuit that uses a base current to raise the potential between the base and the emitter to the voltage at which a transistor Q operates (0.7 V or higher) is formed on a single chip, but since current flows to the split resistors $R_2$ and $R_3$ up to the point when the transistor Q is switched on, the current amplification $h_{FE}$ has poor linearity, as shown by the broken line Q in FIG. 4, and the base current $I_B$ has to be increases in order to increase the collector current $I_C$. FIG. 8 illustrates the relation between the collector current $I_C$ and the saturation operating voltage ($V_{CE(sat)}$) between the collector and emitter, and it can be seen that the base current $I_B$ has to be sufficiently large in order to lower the saturation voltage between the collector and emitter as well.

Furthermore, the input voltage at which the transistor switches on can range anywhere from 1.5 V to several dozen volts depending on the user, and the current can also vary considerably with the user, so the split resistors $R_2$ and $R_3$ have to be manufactured in various combinations of about 1 kΩ to 100 kΩ, and the problem with this is that not only manufacturing, but maintaining inventory also becomes extremely complicated.

Also, with the transistor structure discussed above, the p$^+$-type contact region 14 for obtaining ohmic contact is formed by raising the impurity concentration at the connection between the base region and the base electrode 16, but if the impurity concentration is high in this contact region, the electrons that serve as minority carriers will be blocked by the p/p$^+$ junction between the base region 12 and the contact region 14, meaning that electrons will accumulate in the base region 12 during the switching operation. This results in greater switching loss and hinders high-speed switching (the off time in particular becomes longer), and also leads to higher power consumption.

Furthermore, a problem with the bias setting resulting from the above-mentioned split resistors is that the speed is reduced by such factors as the load capacity of the resistors. Also, noise tends to be picked up if the zener diode is connected externally to the base of the transistor, which necessitates noise elimination by connecting a capacitor in parallel, and the capacity generated by connector leads and so forth also lowers the speed.

Meanwhile, in order to obtain a bipolar transistor with faster transistor switching and lower power consumption, as shown by the cross sectional structure and the equivalent circuit thereof in FIG. 5, the inventors invented a transistor structured such that a diffusion region 24 of a different conductivity type from that of the base region (the same conductivity type as in the emitter region) is formed at the contact of the base electrode 16, and the base electrode 16 is contacted with this diffusion region 24, and this invention was disclosed in U.S. patent application Ser. No. 09/873412. The result of this structure is that the diffusion region 24 becomes a reverse diode toward the sections of the base region 12, and this transistor has a zener diode ZD built into the base as shown in FIG. 5b. Accordingly, the transistor Q is not switched on unless an input voltage over the zener voltage of this zener diode is applied, and can be made to operate as a digital transistor by adjusting this zener voltage.

However, the concentration of the diffusion region 24 has to be adjusted in order to adjust the zener voltage of the zener diode structured as above, but even though it is preferable in terms of the process for the emitter region 13 to be formed at the same time, because of the characteristics required of the transistor, the concentration of the emitter region cannot be freely changed, and even if this diffusion region 24 is formed in a separate step from the emitter region, if the impurity concentration is lowered too much, the contact resistance with the base electrode 16 increases to the point that the desired transistor characteristics are not obtained, and it becomes difficult to produce a transistor that can be operated at an input voltage lower than about 7 V. Also, even if the transistor is not used as a digital transistor, this structure yields a bipolar transistor with high switching speed and low power consumption, as mentioned above, but if the input signal voltage is too low, there will be a problem in that the transistor will not operate until the zener voltage of the reverse diode is lowered.

Moreover, when a digital transistor is produced, the input signals can vary widely with the user, and even if the voltage is set so that the built-in zener diode switches on the transistor, if the input signal has a high voltage and large current, the base current increases, and the amplified collector current also becomes extremely large, which can prevent the desired transistor characteristics from being obtained, or even break the transistor.

SUMMARY OF THE INVENTION

The present invention was conceived in an effort to solve these problems, and it is an object thereof to provide a semiconductor device having a bipolar transistor structured so as to allow the adjustment of the base input signal voltage that switches on a transistor in which a diffusion region of a different conductivity type from that of the base region is formed at the contact of the base electrode.

It is another object of the present invention to provide a semiconductor device having a bipolar transistor structured such that the base current can be controlled and the collector current adjusted, regardless of the base input signal, even when a zener diode is built into the base and a digital transistor is produced.

One embodiment of the semiconductor device pertaining to the present invention has a bipolar transistor constructed such that a zener diode is serially built into a base, comprising a first conductivity type semiconductor layer that serves as a collector region, a base region of a second conductivity type provided to the first conductivity type semiconductor layer, an emitter region of the first conductivity type provided within the base region, a base electrode connection region of the first conductivity type provided to the base region, a zener voltage control diffusion region of the second conductivity type and provided around the periphery of the base electrode connection region so as to form a pn junction and undergo zener breakdown at the desired voltage, a base electrode provided so as to be electrically connected to the base electrode connection region, and an emitter electrode and a collector electrode provided so as to be electrically connected to the emitter region and the collector region, respectively.

With this structure, since a zener voltage control diffusion region of the same conductivity type as the base region is provided around the periphery of the base electrode connection region, the zener voltage can be lowered by keeping the impurity concentration of the zener voltage control diffusion region close to the impurity concentration of the base electrode connection region, so even if the impurity concentration of the base electrode connection region is not lowered, the device can be operated at a low signal voltage of about 1.5 to 5 V. Specifically, the zener voltage is lower the less difference there is in the impurity concentrations between both sides at a pn junction, and the greater is this difference, the higher is the zener voltage. Accordingly, the impurity concentration of the base region cannot be raised that much because of the transistor characteristics, and the impurity concentration of the base electrode connection region must be raised as high as possible because of problems such as contact resistance, but the zener voltage can be freely adjusted regardless of these impurity concentrations.

It is preferable if a resistor is provided so as to be electrically connected to the base electrode connection region, and the base electrode is provided so as to be electrically connected to the resistor, because this will prevent the transistor from being damaged by excess current even if the input signal has a high voltage.

Another embodiment of the semiconductor device pertaining to the present invention comprises a first conductivity type semiconductor layer that serves as a collector region, a base region of a second conductivity type provided to the first conductivity type semiconductor layer, an emitter region of the first conductivity type provided within the base region, a base electrode connection region of the first conductivity type provided to the base region, a resistor provided so as to be electrically connected to the base electrode connection region, a base electrode provided so as to be electrically connected to the resistor, and an emitter electrode and a collector electrode provided so as to be electrically connected to the emitter region and the collector region, respectively.

DESCRIPTION OF THE PREFERRED EMBODIMENTS

Next, the semiconductor device having a bipolar transistor structure of the present invention will be described through reference to the drawings. With the semiconductor device pertaining to the present invention, as shown in FIGS. 1a and 1b, which are a plan view and cross section view of an embodiment thereof, a base region 12 of a second conductivity type (p-type) is formed on the surface of a first conductivity type (n-type) semiconductor layer 11 that serves as the collector region, and an emitter region 13 of a first conductivity type ($n^+$-type) is formed inside this p-type base region 12.

Figure 1:
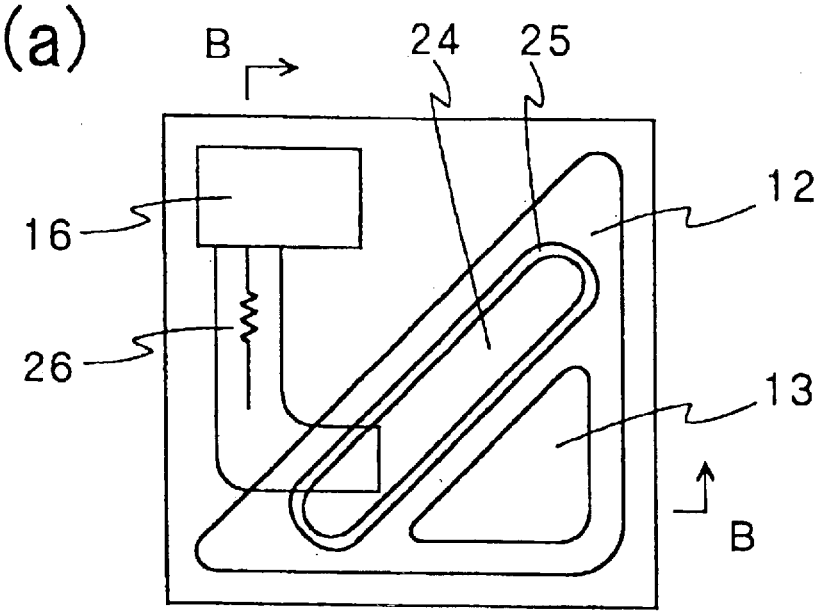
FIG. 1 is a diagram illustrating an embodiment of the semiconductor device having a bipolar transistor structure pertaining to the present invention.
Figure 1:
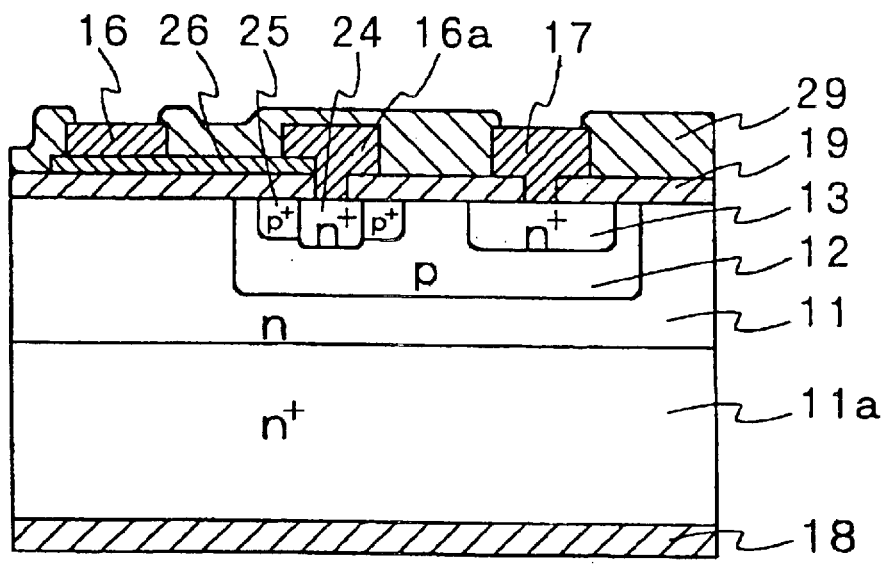
Figure 1:
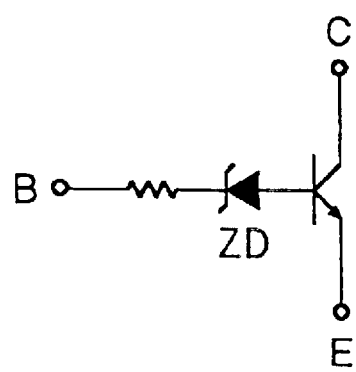

A base electrode connection region 24 of a first conductivity type ($n^+$-type) is provided to the base region 12, a zener voltage control diffusion region 25 of a second conductivity type ($p^+$-type) is provided around the periphery of the base electrode connection region 24 so as to form a pn junction and undergo zener breakdown at the desired voltage, and in the example shown in FIG. 1, a resistor 26 composed of polysilicon is connected to the base electrode connection region 24 via a metal electrode 16a, a base electrode 16 is provided at the other end of this resistor 26, and an emitter electrode 17 and a collector electrode 18 are provided so as to be electrically connected to the emitter region 13 and the collector region 11, respectively. As a result, as seen in the equivalent circuit diagram of FIG. 1c, a bipolar transistor is structured such that a zener diode ZD and the resistor 26 are serially built into the base.

The collector electrode 18 is provided on the back of an $n^+$-type semiconductor substrate 11a on which the n-type semiconductor layer 11 is formed. 19 is an interlayer insulating film of silicon oxide or the like, and 29 is a protective film composed of silicon nitride or the like.

As discussed above, the inventors have disclosed in U.S. patent application Ser. No. 09/873412 a transistor structure with which minority carriers can be eliminated early on in switching, which speeds up switching and reduces power consumption, by forming the base electrode connection region 24 of a different conductivity type from that of the base region 12 at the portion of the base region 12 that connects with the base electrode 16, but the present invention is characterized in that a base electrode connection region of a different conductivity type from that of the base region is utilized as a reverse zener diode so that the transistor can operate as a digital transistor, and the zener voltage control diffusion region 25 of the same conductivity type as the base region is formed around the periphery of the base electrode connection region so that even when the transistor is not used as a digital transistor, it will operate with respect to low input signals and operates as a semiconductor device with a high switching speed.

The base electrode connection region 24 is of the same conductivity type as the emitter region 13, and can be formed at the same impurity concentration at the same time as the emitter region 13. This base electrode connection region 24 can also be formed in a separate step from the emitter region 13, and its impurity concentration made different from that of the emitter region 13, but if the impurity concentration is too low, there will be an increase in contact resistance with the base electrode, so the impurity concentration is preferable about $1 \times 10^{17}$ cm$^{-3}$ or higher. On the other hand, the impurity concentration of the emitter region 13 must be about $1 \times 10^{16}$ to $1 \times 10^{18}$ cm$^{-3}$ in order to raise the current amplification of the transistor or enhance the characteristics.

The reverse zener voltage of the diode composed of a pn junction formed between the base electrode connection region 24 and the base region 12 is higher the greater is the difference in the impurity concentrations of the two, and is lower the smaller is the concentration differential. However, as mentioned above, the impurity concentrations of the two are limited by the characteristics of the transistor, and for the transistor to be operated at a level of high performance, the difference in the impurity concentrations of the two goes over a certain amount and the zener breakdown voltage becomes about 7 to 30 V. Consequently, it is difficult to switch on a transistor at a lower signal voltage while maintaining the high performance of the transistor, and, for example, to switch on a transistor at the desired low signal voltage of about 1.5 to 5 V, as with a digital transistor connected to an LSI logic circuit.

In view of this, with the present invention, the base electrode connection region 24 is made n$^+$-type, which is the opposite of the conductivity type of the base region 12, and the zener voltage control diffusion region 25 is formed around the periphery of the base electrode connection region 24 so that the impurity concentration of the p-type region forming the pn junction with this connection region can be adjusted to the desired level. This increases the switching speed and lowers power consumption, while allowing the transistor to be operated by input signals of lower voltage, or operating as a digital transistor that undergoes zener breakdown at the desired voltage.

Figure 2:
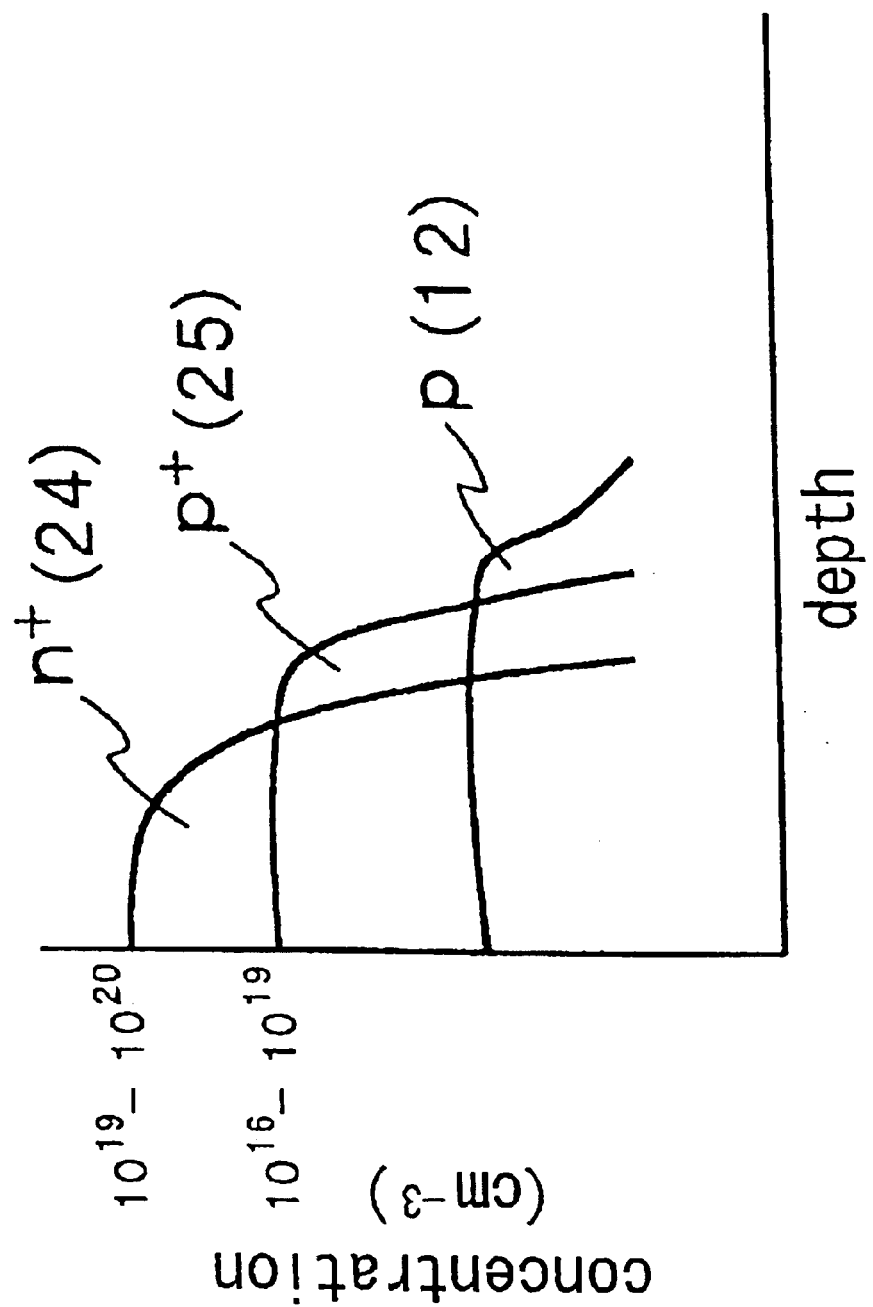
FIG. 2 is a schematic graph of the relation between the impurity concentrations in the base electrode connection region, the zener voltage control diffusion region, and the base region.

This zener voltage control diffusion region 25 forms a region with a larger impurity concentration than the base region, and undergoes zener breakdown at a lower voltage, so if it is formed in part of the pn junction with the base electrode connection region 24, zener breakdown will occur there. Accordingly, even though this region is not formed all the way around the base electrode connection region 24, the objective can be sufficiently achieved with a diffusion region that is shallower than the diffusion depth of the base electrode connection region or part of the periphery. From the standpoints of contact resistance with the metal electrode and so forth, as discussed above, the impurity concentration of the base electrode connection region 24 is set to a specific impurity concentration of about $1 \times 10^{19}$ to $1 \times 10^{20}$ cm$^{-3}$, for example, and the impurity concentration of the zener voltage control diffusion region 25 is kept to the desired level within a range of $1 \times 10^{16}$ to $1 \times 10^{19}$ cm$^{-3}$, which allows even a transistor that switches on at the desired input voltage, such as a digital transistor, to be formed easily, and allows the transistor characteristics to be maintained at a high level, without adversely affecting them in any way. FIG. 2 shows the relation of the impurity concentrations in the base electrode connection region 24 (n$^+$), the zener voltage control diffusion region 25 (p$^+$), and the base region 12 (p).

It is preferable for this zener voltage control diffusion region 25 to be formed, for example, by forming a diffusion region of the base electrode connection region 24, and then forming a mask provided with an opening around its periphery, and diffusing p+-type impurities, because there will be no danger of lowering the impurity concentration of the base electrode connection region. In this case, the mask must be aligned so that the base electrode connection region 24 and the zener voltage control diffusion region 25 are not too far apart and do not overlap, but a slight amount of mask misalignment will pose no problem.

The example illustrated in FIG. 1 is one of a digital transistor in which the pn junction between the base electrode connection region and the base region is used as a zener diode. The resistor 26 is connected serially to this zener diode, and the base electrode 16 is formed at the other end of this resistor 26. In the example shown in FIG. 1, this resistor 26 is formed from a polysilicon film via the interlayer insulating film 19 on the surface of the semiconductor substrate, over which the insulating film 29 is formed as a protective film that covers this resistor. However, the resistor 26 may instead be a diffusion resistor diffused in a semiconductor layer, rather than being formed from polysilicon.

Figure 3:
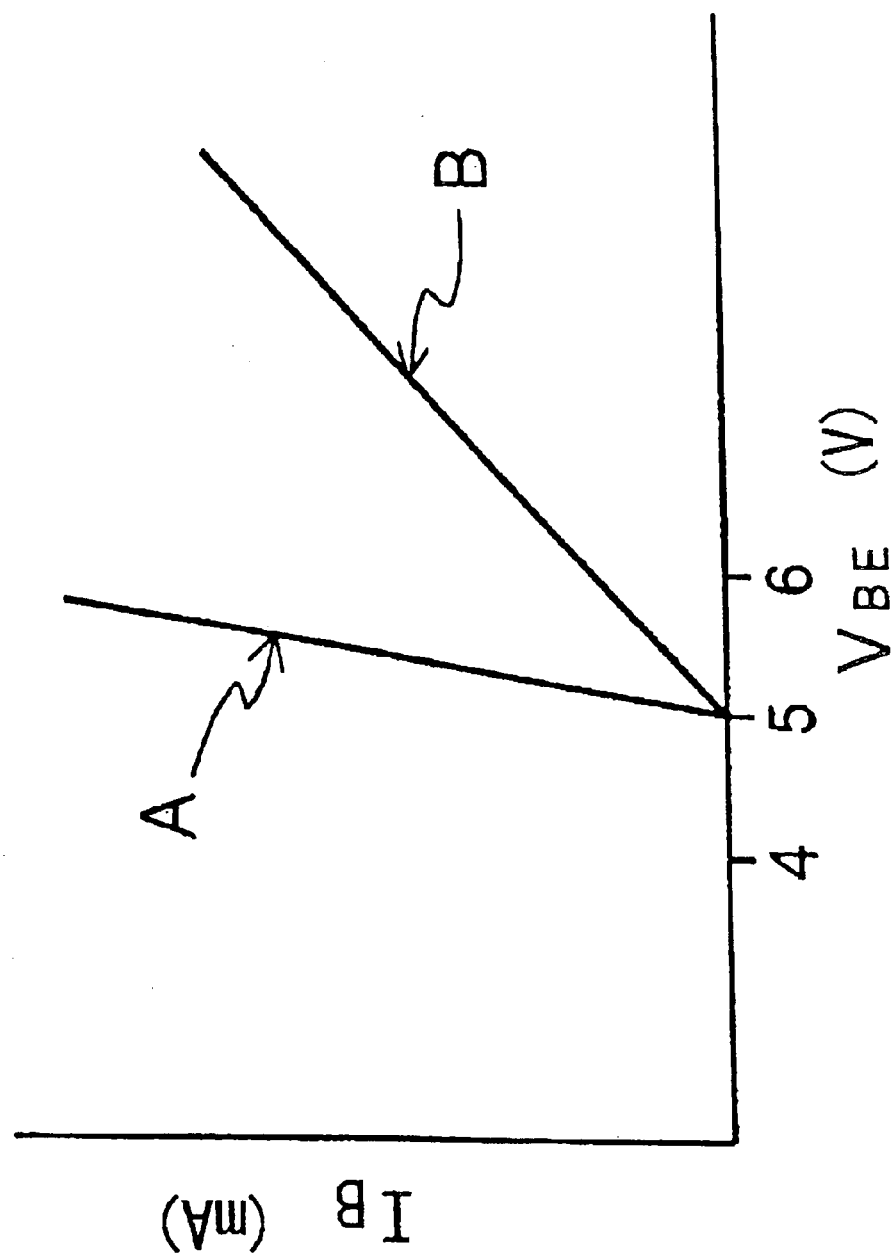
FIG. 3 is a schematic graph of the change in base current $I_B$ versus the voltage between the base and emitter $V_{BE}$ when the resistor in FIG. 1 is and is not used.

The purpose of connecting this resistor 26 to the base side is so that, even when a high voltage is applied to the base, a large base current will not flow and not cause an extremely large collector current in order to keep the transistor from being damaged. Specifically, with a digital transistor in which a zener diode is inserted in a base, as the relation between the base/emitter voltage $V_{BE}$ and the base current $I_B$ is indicated by A in FIG. 3, if the zener voltage is 5 V, for instance, the base current $I_B$ will not flow and the transistor will not be switched on up to 5 V. Once 5 V is exceed, though, the base current $I_B$ begins to flow, the transistor is switched on, and when the base/emitter voltage $V_{BE}$ becomes larger, $I_B$ also increases sharply. Accordingly, the amplified collector current $I_C$ also increases sharply, which means there is a danger of transistor damage.

On the other hand, if the resistor 26 is connected in series to the base, when the base current $I_B$ begins to flow, the voltage is depressed by this current, and the voltage applied between the base region and emitter region of the transistor drops by the amount of voltage depression produced by this resistor. Specifically, as shown by B in FIG. 3, when the voltage applied to the base electrode is increased, the trend to the increase in base current is inclined, and an excessive increase in base current can be prevented.

The rest of the structure other than the base electrode connection region 24, the zener voltage control diffusion region 25, and the resistor 26 is the same as in a conventional bipolar transistor, and the impurity concentrations of the base region 12 and the n-type semiconductor layer 11 that serves as the collector region are set according to the reverse breakdown voltage to be used and other such factors. The example shown in FIG. 1, as illustrated by the plan view of the semiconductor layer surface in FIG. 1a, is an example of a simple structure in which the triangular (in plan view)

n⁺-type emitter region 13 is formed inside the triangular p-type base region 12, and the base electrode connection region 24 and the zener voltage control diffusion region 25 are formed on the bottom side of the triangle of base region, with the resistor 26 made of polysilicon being formed in a portion where no transistor is formed. The purpose of this is to prevent the transistor from being damaged if the insulating film should be damaged by discharge or the like.

Figure 4:
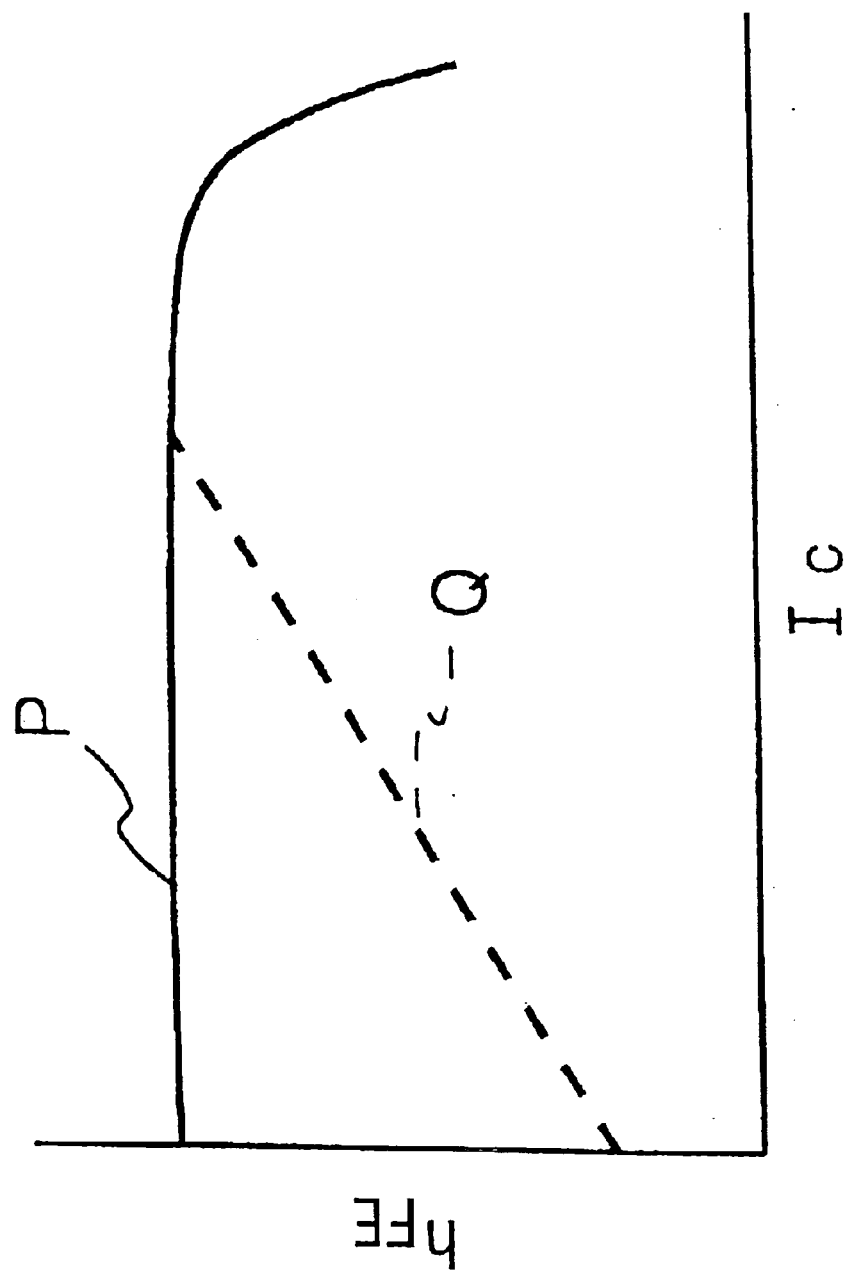
FIG. 4 is a schematic graph illustrating the relation of current amplification factor $h_{FE}$ to the collector current $I_C$ in FIG. 1, as compared to a conventional structure.
Figure 5A:
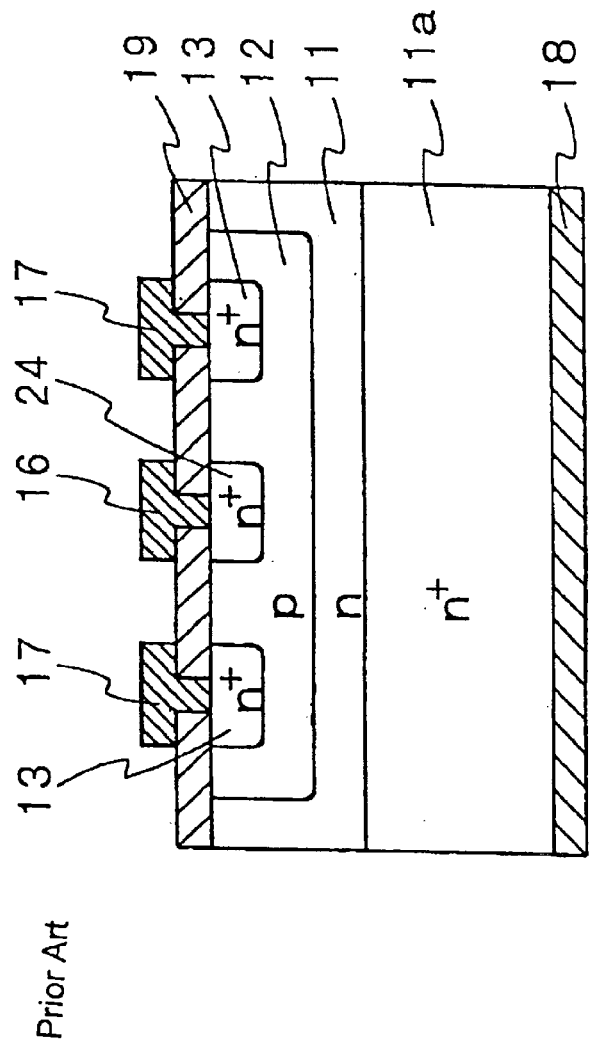
FIG. 5 is a diagram illustrating the cross sectional structure of a bipolar transistor developed in an effort to raise switching speed and lower power consumption.
Figure 5B:
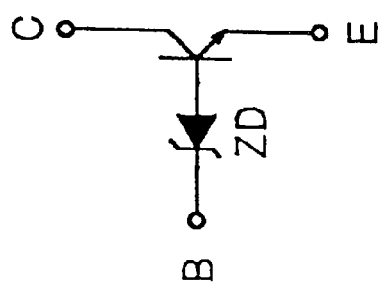
Figure 6:
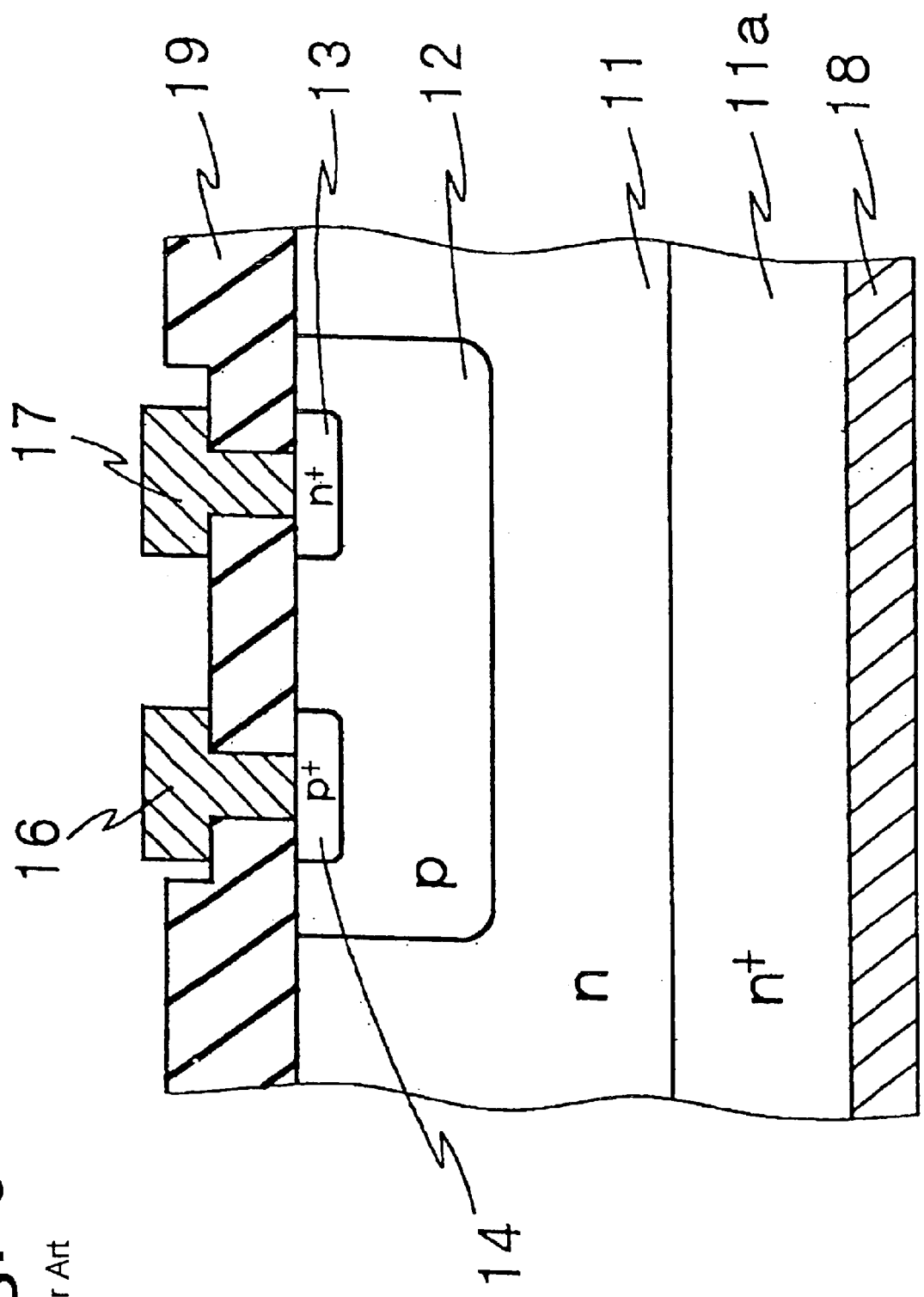
FIG. 6 is a cross sectional diagram illustrating an example of the structure of a conventional bipolar transistor.

As discussed above, with the present invention, a zener diode is serially built into the base of a transistor, so a digital transistor can be obtained in which the transistor is switched on by a specific input over the zener voltage of this zener diode. As a result, unlike with a conventional digital transistor that utilized resistor splitting, the base current is almost zero at a voltage low enough that the transistor will not switch on, so there is no wasted base current like a current flowing to the split resistors. Accordingly, as shown by P in the graph in FIG. 4 of the relation of the current amplification factor ($I_C/I_B$) $h_{FE}$ to the collector current $I_C$, constant characteristics are obtained for the current amplification factor $h_{FE}$ even when the collector current $I_C$ is small, which is in marked contrast to the conventional characteristics indicated by Q in FIG. 4, and this affords high-performance transistor operation. This is because there is no unused current due to split resistors, so all of the base current $I_B$ is amplified and causes the collector current $I_C$, whereas with a conventional digital transistor that utilizes split resistors, unused current, albeit a small amount, flows through the split resistors, and when the base current $I_B$ is small, this proportion is large and shows up in pronounced form in the current amplification factor $h_{FE}$, but as the base current $I_B$ grows, the proportion decreases and does not appear as much in the current amplification factor $h_{FE}$.

Figure 7:
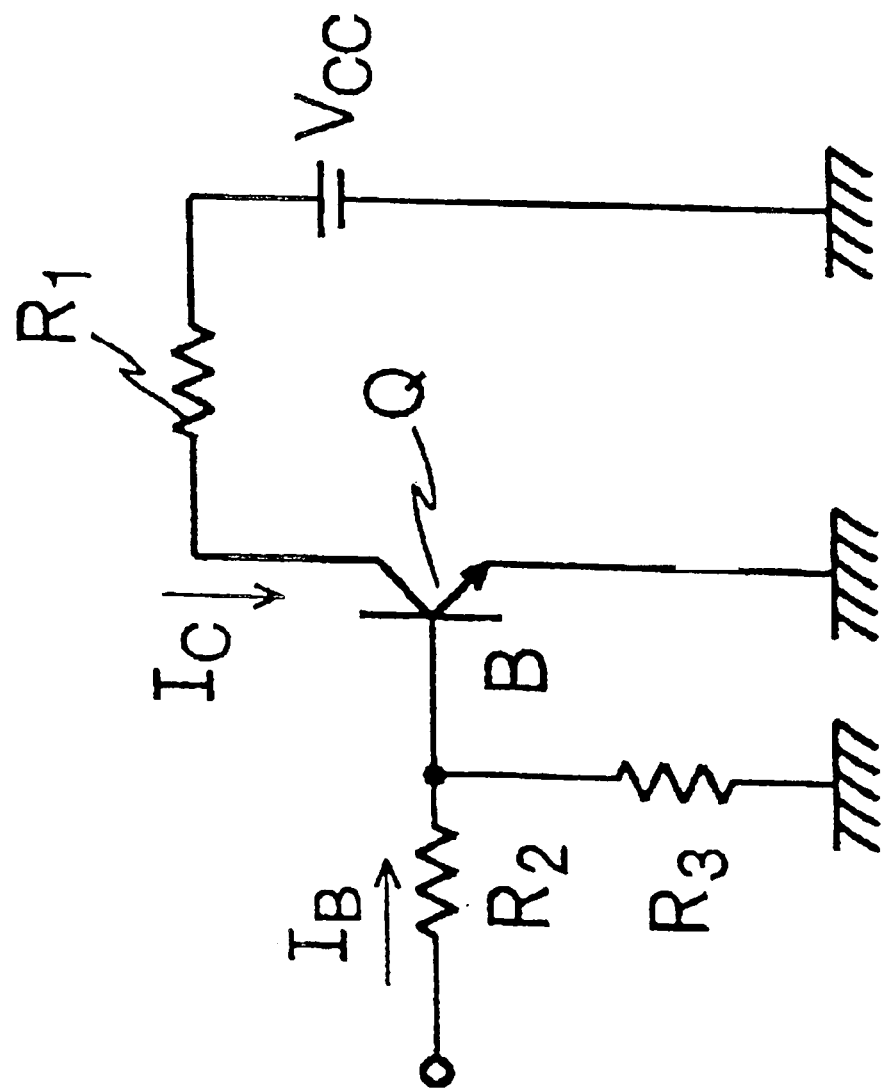
FIG. 7 is a diagram of an example of a circuit when a conventional bipolar transistor is used as a digital transistor.
Figure 8:
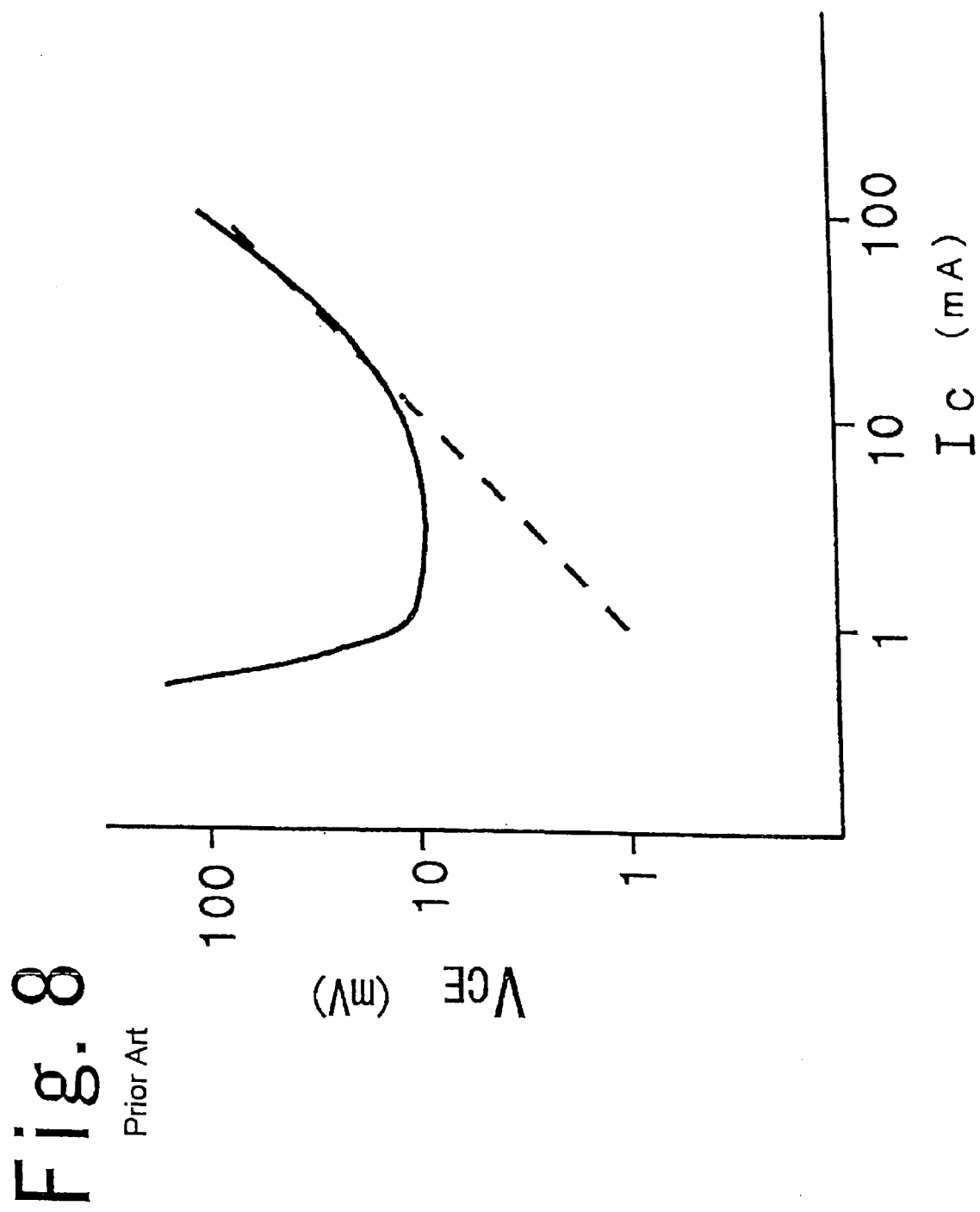
FIG. 8 is a schematic graph of the relation between the collector current $I_C$ and the saturation voltage $V_{CE}$ between the collector and emitter with regard to the digital transistor shown in FIG. 7.

Furthermore, with a conventional digital transistor, various combinations of the split resistors $R_2$ and $R_3$ shown in FIG. 7 have to be produced as dictated by how the transistor will be used by the user, but with the present invention, the digital voltage settings at which the transistor is switched on can be about 1.5 V, 3 V, 5 V, and 12 V according to the zener voltage control diffusion region, and for each of these, just resistors of 10 kΩ and 100 kΩ, for instance, need be connected, with no need to have so many resistor combinations.

In addition, noise tends to be picked up when a zener diode is attached externally (connecting the zener diode to the base lead of the transistor), and the transistor may be switched on by this noise, so a capacitor has to be installed in parallel in order to eliminate this noise, but with the present invention, since the zener diode is built in, noise is not picked up as readily, parasitic capacity is formed in the zener diode, and there is no need at all for such noise elimination measures.

In the example given above, the transistor had a simple structure consisting of a single emitter region and a single base region, but when a larger current is required, it is possible to use a multi-emitter structure, a stripe emitter structure, a multi-base structure, or the like. Also, when a resistor is connected, it is not limited to a resistor made of polysilicon, and may instead be another resistor such as a diffusion resistor. Also, if there is no danger of damage to the insulating film, the resistor can be formed on the insulating film over a transistor.

Furthermore, when the input signal is substantially constant and there is no danger of an excessively high base current, there is no need to connect a resistor. If the input voltage is higher than about 7 V, it is also possible to adjust the zener voltage by varying the impurity concentration of the base electrode connection region, without forming the above-mentioned zener voltage control diffusion region.

With the present invention, even with a digital transistor that switches on only when a specific voltage or higher is inputted, that specific voltage can be freely set while maintaining the characteristics of the transistor. Furthermore, since there is no wasted base current, a digital transistor with a large current amplification factor can be obtained even in portions with a small base current.

Also, if a resistor is built in on the base side, even if a voltage higher than the zener voltage is applied, the base current will not rise so high that the desired collector current cannot be obtained for the transistor, or that the transistor is damaged, allowing excellent transistor characteristics to be maintained.

What is claimed is:

1. A semiconductor device having a bipolar transistor constructed such that a zener diode is serially build into a base, and comprising:

a first conductivity type semiconductor layer that serves as a collector region;

a base region of a second conductivity type provided to said first conductivity type semiconductor layer;

an emitter region of said first conductivity type provided within said base region;

a base electrode connection region of said first conductivity type provided to said base region;

a base electrode provided so as to be electrically connected to said base electrode connection region:

a zener voltage control diffusion region of said second conductivity type and provided around a periphery of said base electrode connection region so as to form a pn junction and undergo zener breakdown at a desired voltage, wherein the zener voltage control diffusion region is highly doped and is isolated electrically from the base electrode connection region; and an emitter electrode and a collector electrode provided so as to be electrically connected to said emitter region and said collector region, respectively, wherein the base electrode connection region extends into the base region at a first depth and the zener voltage control diffusion region extends into the base region at a second depth less than the first depth.

2. A semiconductor device according to claim 1, wherein a resister is to be electrically connected to said base electrode connection region, and said base electrode is provided so as to be electrically connected to said resistor.

* * * * *